US008885399B2

(12) United States Patent
Storms et al.

(10) Patent No.: US 8,885,399 B2
(45) Date of Patent: Nov. 11, 2014

(54) PHASE CHANGE MEMORY (PCM) ARCHITECTURE AND A METHOD FOR WRITING INTO PCM ARCHITECTURE

(75) Inventors: Maurits Mario Nicolaas Storms, Best (NL); Erik Maria van Bussel, Eindhoven (NL); Godefridus Adrianus Maria Hurkx, Best (NL); Michiel Jos van Duuren, Valkenswaard (NL)

(73) Assignee: NXP B.V., Eindhoven (NL)

( * ) Notice: Subject to any disclaimer, the term of this patent is extended or adjusted under 35 U.S.C. 154(b) by 433 days.

(21) Appl. No.: 13/075,037

(22) Filed: Mar. 29, 2011

(65) Prior Publication Data

US 2012/0250401 A1 Oct. 4, 2012

(51) Int. Cl.
  G11C 11/56 (2006.01)
  G11C 8/00 (2006.01)
  G11C 13/00 (2006.01)

(52) U.S. Cl.
  CPC ........ G11C 13/0004 (2013.01); *G11C 2213/79* (2013.01); *G11C 2213/82* (2013.01); G11C 13/0026 (2013.01); G11C 13/0028 (2013.01); *G11C 13/0069* (2013.01)
  USPC ..................... 365/163; 365/230.06

(58) Field of Classification Search
  CPC ........... G11C 13/0026; G11C 13/0028; G11C 13/0069; G11C 2213/79; G11C 2213/82; G11C 13/0004
  USPC ........................................... 365/230.06, 163
  See application file for complete search history.

(56) References Cited

U.S. PATENT DOCUMENTS

| | | | | |
|---|---|---|---|---|
| 6,411,543 | B2 * | 6/2002 | Narui et al. | 365/149 |
| 6,995,999 | B2 * | 2/2006 | Morimoto | 365/148 |
| 8,009,457 | B2 * | 8/2011 | Li et al. | 365/148 |
| 8,250,282 | B2 | 8/2012 | Confalonieri et al. | |
| 2004/0027907 | A1 * | 2/2004 | Ooishi | 365/226 |
| 2005/0185445 | A1 | 8/2005 | Osada et al. | |
| 2007/0012959 | A1 * | 1/2007 | Hachino et al. | 257/260 |
| 2008/0007993 | A1 * | 1/2008 | Saitoh et al. | 365/158 |
| 2008/0025070 | A1 * | 1/2008 | Horii et al. | 365/148 |
| 2008/0049487 | A1 * | 2/2008 | Yoshimura et al. | 365/148 |
| 2009/0067228 | A1 * | 3/2009 | Kang et al. | 365/163 |
| 2010/0073999 | A1 | 3/2010 | Kitai et al. | |
| 2010/0142245 | A1 | 6/2010 | Kitagawa | |

FOREIGN PATENT DOCUMENTS

CN    101887350 A    11/2010

OTHER PUBLICATIONS

European Search Report, 12161777.3, Jul. 16, 2012.
Office Action from Foreign Counterpart Patent Appln. CN201210082569.8.

* cited by examiner

Primary Examiner — Vanthu Nguyen
Assistant Examiner — Khamdan Alrobaie

(57) ABSTRACT

A phase change memory (PCM) architecture and a method for writing a PCM architecture are described. In one embodiment, a PCM architecture includes a PCM array, word line driver circuits, bit line driver circuits, a source driver circuit and a voltage supply circuit. The bit line driver circuits are connected to the PCM array and the electrical ground. Other embodiments are also described.

20 Claims, 7 Drawing Sheets

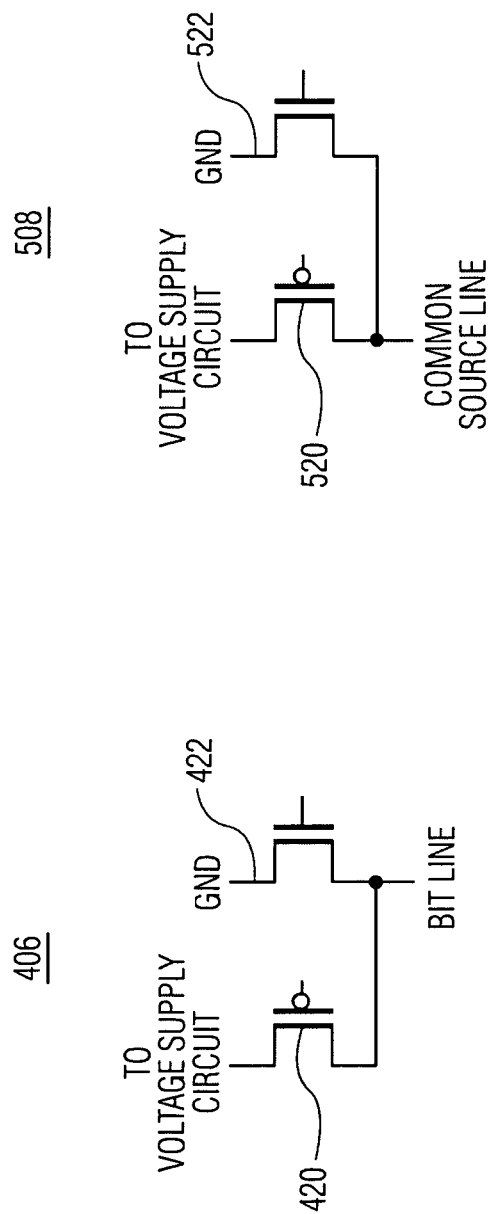

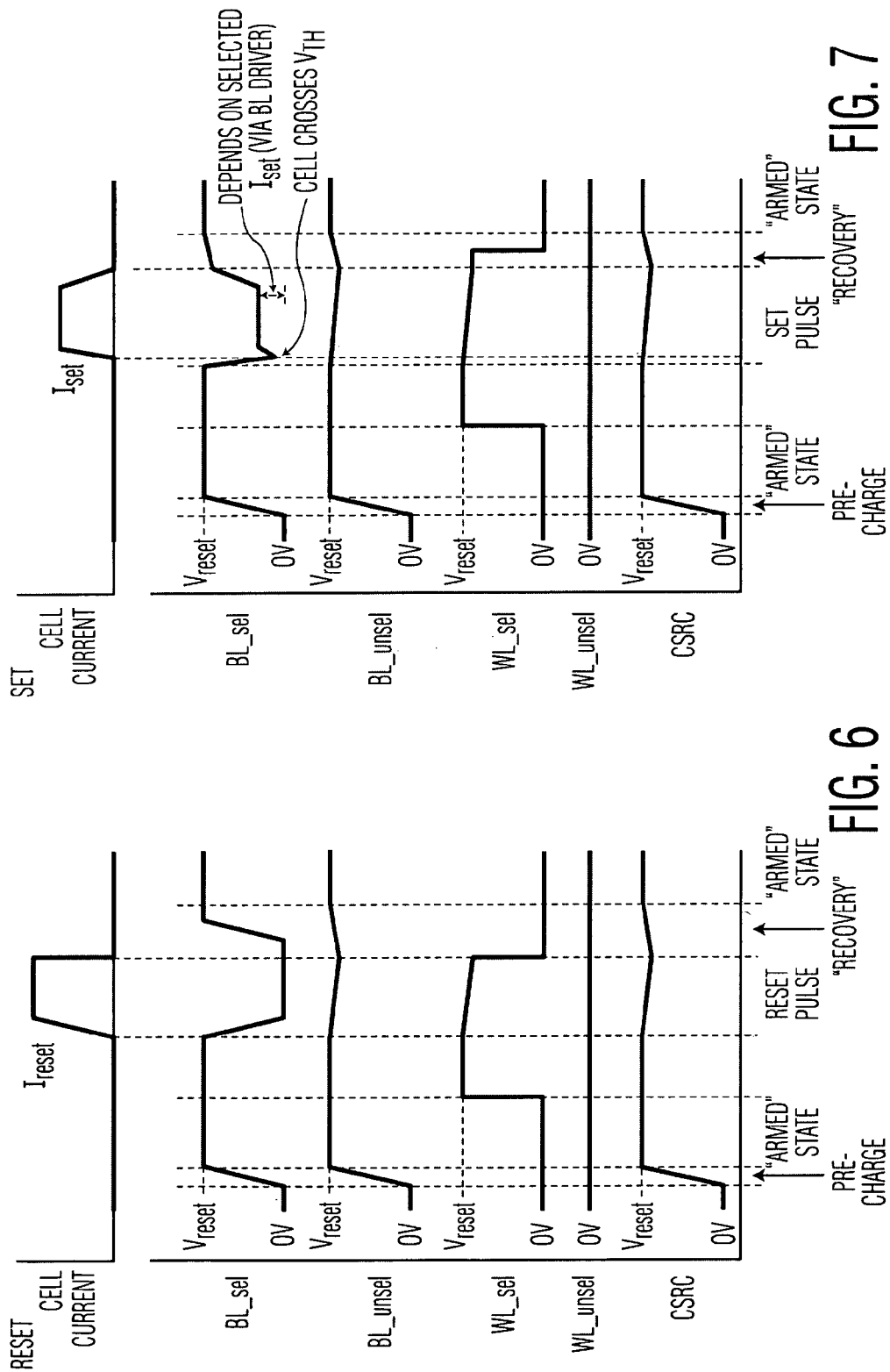

PHASE CHANGE MEMORY (PCM) ARCHITECTURE AND A METHOD FOR WRITING INTO PCM ARCHITECTURE

Embodiments of the invention relate generally to electronic systems and methods, more particularly, to memory architectures and methods for writing into the memory architectures.

A phase change memory (PCM) architecture operates by switching PCM elements between different resistance states. The PCM architecture can be used in various devices and for different applications. For example, the PCM architecture can be used to replace a conventional non-volatile memory architecture, such as a Flash memory architecture or an Electrically Erasable Programmable Read-Only Memory (EEPROM) architecture. Compared with the conventional non-volatile memory architecture, the PCM architecture has a higher write speed for small data chunks, a higher endurance, a lower cost and a smaller module size.

To write data into the PCM architecture, a relatively large current as well as a relatively high voltage, which is well above the typical supply voltage for a complementary metal oxide semiconductor (CMOS) memory, are needed. Therefore, it is necessary to boost the supply voltage of the PCM architecture, for instance, with an on-chip charge pump. However, the large write current inherent to PCM calls for a strong and large charge pump, since a small charge pump does not have sufficient output drive to sustain the required voltages. Moreover, the write pulses in the PCM architecture may have spikes, which can cause stability issues for the PCM architecture.

A phase change memory PCM architecture and a method for writing into a PCM architecture are described. In one embodiment, a PCM architecture includes a PCM array, word line driver circuits, bit line driver circuits, a source driver circuit and a voltage supply circuit. The bit line driver circuits are connected to the PCM array and the electrical ground. Other embodiments are also described.

In an embodiment, a PCM architecture includes a PCM array, word line driver circuits, bit line driver circuits, a source driver circuit and a voltage supply circuit. The PCM array includes rows of PCM cells, where each of the rows of PCM cells includes PCM cells, and where each PCM cell includes a PCM element configured to store a value and a selection device connected to the PCM element and used to select the PCM element. The word line driver circuits are connected to the rows of PCM cells, where each of the word line driver circuits is used to access one of the rows of PCM cells. The bit line driver circuits are connected to the rows of PCM cells and the electrical ground, where each of the bit line driver circuits is used to access a PCM cell in each of the rows of PCM cells. The source driver circuit is connected to source terminals of at least some of the selection devices in the PCM array and the electrical ground. The voltage supply circuit is connected to the word line driver circuits, the bit line driver circuits and the source driver circuit.

In another embodiment, a PCM architecture includes a PCM array, word line driver circuits, bit line driver circuits, a source driver circuit and a voltage supply circuit. The PCM array includes rows of PCM cells, where each of the rows of PCM cells includes PCM cells, and where each PCM cell includes a PCM element configured to store a value and a selection device connected to the PCM element and used to select the PCM element. The word line driver circuits are connected to the rows of PCM cells, where each of the word line driver circuits is used to access one of the rows of PCM cells. The bit line driver circuits are connected to the rows of PCM cells and the electrical ground, where each of the bit line driver circuits is connected to a PCM cell in each of the rows of PCM cells through a bit line, and where each of the bit line driver circuits includes a p-channel metal oxide semiconductor (PMOS) transistor connected to the voltage supply circuit and a corresponding bit line and an n-channel metal oxide semiconductor (NMOS) transistor connected to the electrical ground and the corresponding bit line. The source driver circuit is connected to source terminals of at least some of the selection devices in the PCM array and the electrical ground. The voltage supply circuit is connected to the word line driver circuits, the bit line driver circuits and the source driver circuit, where the voltage supply circuit is the only voltage supply source for the word line driver circuits and the bit line driver circuits.

In an embodiment, a method for writing into a PCM architecture involves charging a source driver circuit and a PCM array of the PCM architecture using a voltage supply circuit of the PCM architecture, where the PCM array includes PCM cells, where the PCM cells are connected to bit line driver circuits of the PCM architecture via bit lines and connected to word line driver circuits of the PCM architecture via word lines, and where the source driver circuit of the PCM architecture and the bit line driver circuits of the PCM architecture are connected to the electrical ground; connecting a selected word line to the voltage supply circuit via one of the word line driver circuits; and pulling down a selected bit line using one of the bit line driver circuits.

Other aspects and advantages of embodiments of the present invention will become apparent from the following detailed description, taken in conjunction with the accompanying drawings, depicted by way of example of the principles of the invention.

FIG. 4 depicts an embodiment of one of the bit line driver circuits of FIG. 1.

FIG. 5 depicts an embodiment of the common source driver circuit of FIG. 1.

FIG. 6 shows a pulse sequence diagram for a RESET action of the PCM architecture of FIG. 1.

FIG. 7 shows a pulse sequence diagram for a SET action of the PCM architecture of FIG. 1.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
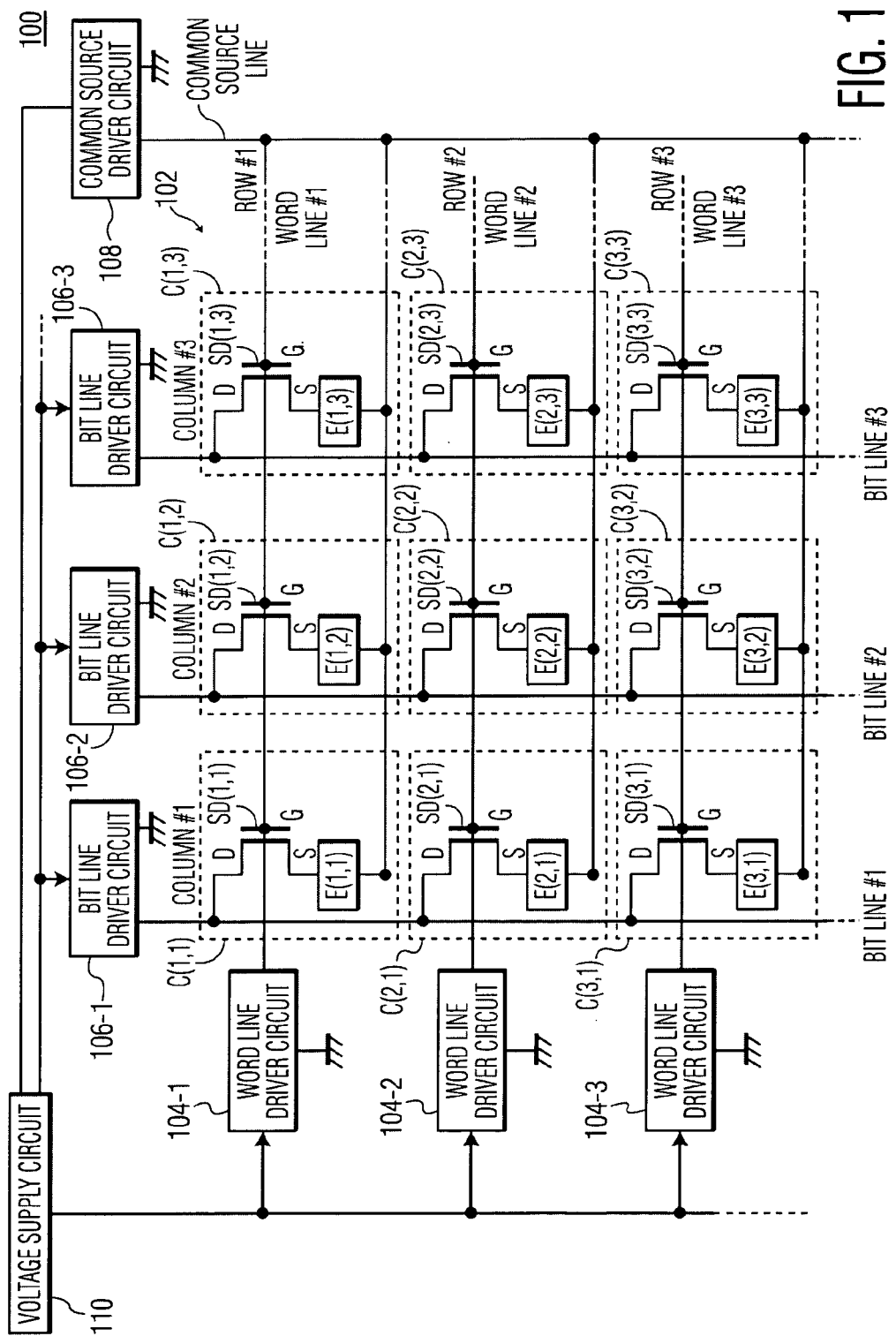
FIG. 1 is a schematic block diagram of a PCM architecture in accordance with an embodiment of the invention.

FIG. 1 is a schematic block diagram of a PCM architecture 100 in accordance with an embodiment of the invention. The PCM architecture can be used to replace a conventional non-volatile memory architecture. The PCM architecture can be used for embedded memories as well as for standalone memories. For example, the PCM architecture may be used in an embedded device, such as an embedded microcontroller. The PCM architecture can work in various processes, such as conventional CMOS compatible processes and new processes. In an embodiment, the PCM architecture is a PCM Integrated Circuit (IC).

The PCM architecture 100 includes a PCM array 102, word line driver circuits 104-1 . . . 104-N, where N is a positive integer, bit line driver circuits 106-1 . . . 106-M, where M is a positive integer, a common source driver circuit 108 and a voltage supply circuit 110. In some embodiments, the PCM architecture includes one or more additional components in addition to the above-mentioned components. For example, the PCM architecture may include one or more circuits for reading out information stored in the PCM array, such as a row decoder and/or a column decoder, and one or more sense amplifiers, which can be voltage sense amplifiers and/or current sense amplifiers. In the embodiment depicted in FIG. 1, the PCM architecture 100 includes word line driver circuits 104-1, 104-2, 104-3 and bit line driver circuits 106-1, 106-2, 106-3.

The PCM array 102 include N row(s) and M column(s) of PCM cell(s) C(1,1) . . . C(N,M), where N and M are both positive integers. The number of row(s) of PCM cell(s) in the PCM array is the same as the number of word line driver circuit(s). The number of PCM cell(s) in each row, which is the number of PCM cell column(s), is the same as the number of bit line driver circuit(s). For example, row 1 of the PCM array includes PCM cell(s) C(1,1) to C(1,M), while row N of the PCM array includes PCM cell(s) C(N,1) to C(N,M). In the embodiment depicted in FIG. 1, the PCM array includes at least three rows of PCM cells and each row includes at least three PCM cells. Specifically, row 1 of the PCM array includes at least three PCM cells C(1,1), C(1,2), C(1,3), row 2 of the PCM array includes at least three PCM cells C(2,1), C(2,2), C(2,3) and row 3 of the PCM array includes at least three PCM cells C(3,1), C(3,2), C(3,3).

Each of the PCM cells C(1,1) . . . C(N,M) in the PCM array 102 includes one of PCM elements E(1,1) . . . E(N,M) and one of selection devices SD(1,1) . . . SD(N,M). The PCM element of a PCM cell is configured to store a value. In an embodiment, the PCM element is made of a chalcogenide material, such as Ge, Sb or Te. The PCM element can switch between different resistance states. The selection device of a PCM cell is connected in series to the PCM element and is used to select the PCM element. In the embodiment depicted in FIG. 1, the selection device of each PCM cell is connected to a bit line as well as a word line. The selection device may be any semiconductor selection device, such as a diode, a bipolar transistor or a metal oxide semiconductor (MOS) transistor. In an embodiment, the selection device is chosen as a result of a trade-off between multiple factors, such as technology complexity, costs, substrate area and drive current. In the embodiment depicted in FIG. 1, the selection device is a MOS transistor. Because of the baseline compatibility of the MOS transistor, MOS transistors are advantageous to be used in embedded PCM memories.

Figure 2:
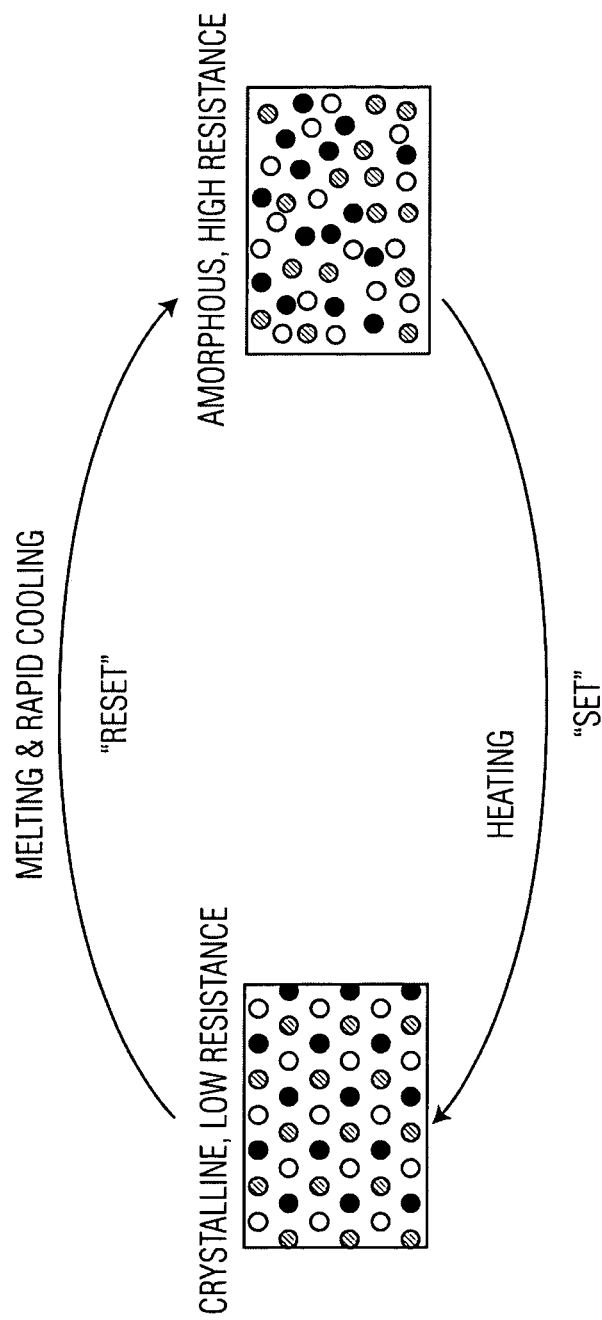
FIG. 2 illustrates switching between different resistive states of one of the PCM elements of FIG. 1.

FIG. 2 illustrates switching between different resistive states of one of the PCM elements E(1,1) . . . E(N,M) of FIG. 1. The PCM element switches between a high resistance (amorphous) state and a low resistance (crystalline) state. For example, the resistance of the PCM element at the crystalline state can be dropped by approximately three orders of magnitude of the resistance of the PCM element at the amorphous state. When the PCM element is in the low resistance crystalline state, the PCM element can be melted and rapidly cooled to the amorphous high ohmic state. The switching action from the crystalline state to the amorphous state is known as a "RESET" action. When the PCM element is in the amorphous high ohmic state, the PCM element can be heated into the crystalline state. The switching action from the amorphous state to the crystalline state is known as a "SET" action.

Figure 3:
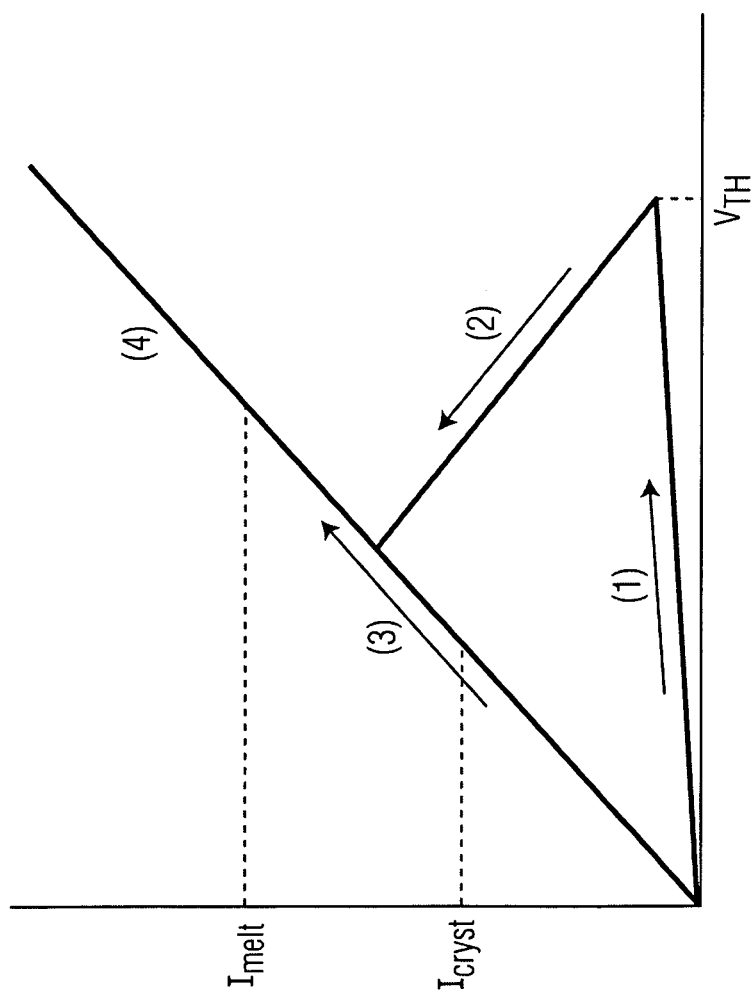
FIG. 3 illustrates a current/voltage curve of one of the PCM elements of FIG. 1.

FIG. 3 illustrates a current/voltage curve of one of the PCM elements E(1,1) . . . E(N,M) of FIG. 1. In region (1), the PCM element is in the stable high ohmic state. When a low voltage is applied to the corresponding one of the PCM cells C(1,1) . . . C(N,M), there is almost no current in the material of the PCM element, which results in no Joule heating to the PCM element. However, when the applied voltage is above a threshold voltage "$V_{TH}$," an electronic breakdown happens in the material of the PCM element and the PCM element suddenly switches to the conducting crystalline state in region (2) in a SET action. If the current/voltage is tuned correctly (above "Icryst" but below "$I_{melt}$") the resulting Joule heating is sufficient to heat the PCM element above its crystallization temperature but below its melting point. The bias on the PCM cell in the SET action is large enough to overcome the threshold voltage $V_{TH}$, but on the other hand, the current is limited to prevent melting of the material of the PCM element such that the PCM element goes into the stable crystalline state in region (3). When the PCM element is in the crystalline state, the PCM element can be melted by applying a high voltage/current to the PCM element. The electric power of the applied voltage/current can be removed abruptly such that there is no sufficient time for the atoms in the material of the PCM element to order properly. Thus, the material of the PCM element is "quenched" into the amorphous (high ohmic) state when the PCM element cools down in region (4). Reading the content of a PCM cell can be done by measuring resistance of the PCM element in the PCM cell.

Turning back to FIG. 1, the word line driver circuits 104-1 ... 104-N of the PCM architecture 100 are connected to the voltage supply circuit 110, the electrical ground and row(s) 1 ... N of the PCM array 102, respectively. At least one of the word line driver circuits can be implemented by an inverter circuit. The word line driver circuits are used to access the corresponding rows of the PCM array via the access transistors SD(1,1) ... SD(N,M) through word lines 1-N. Specifically, each of the word line driver circuits is connected gate terminals, which are labeled with "G," of the access transistors of the PCM cells in the corresponding row through a word line. In the embodiment depicted in FIG. 1, the word line driver circuits 104-1, 104-2, 104-3 are connected to the electrical ground and gate terminals of the access transistors SD(1,1) ... SD(3,3) in row 1, row 2 and row 3 of the PCM array, respectively.

The bit line driver circuits 106-1 ... 106-M of the PCM architecture 100 are connected to the electrical ground and column(s) 1-M of the PCM array 102. The bit line driver circuits are used to access the PCM cells C(1,1) ... C(N,M) via the access transistors SD(1,1) ... SD(N,M) through bit lines 1-M. In an embodiment, the PCM architecture may include one or more sense amplifiers (not shown) and each of the sense amplifiers is connected between two consecutive bit lines. Each of the bit line driver circuits is used to access a PCM cell in each row of the PCM array. In other words, each of the bit line driver circuits is used to access the PCM cell(s) in a column of the PCM array. Specifically, each of the bit line driver circuits is connected to a drain terminal, which is labeled as "D," of the access transistor of a PCM cell in each row of the PCM array through a bit line. In the embodiment depicted in FIG. 1, the bit line driver circuits 106-1, 106-2, 106-3 are connected to the electrical ground and drain terminals of the access transistors SD(1,1) ... SD(3,3) in row 1, row 2 and row 3 of the PCM array. The current switching in the bit lines is not done with respect to the relatively unstable supply voltage, applied via the common source driver circuit 108, but with respect to the electrical ground, as described below. Therefore, the bit line driver circuits can be made with an NMOS transistor. An NMOS transistor has approximately twice the drive current of a PMOS transistor of the same size. Compared with the PMOS transistors, the area advantage of the NMOS transistors makes controlling the bit line current easier and writing into the PCM array more reliable.

FIG. 4 depicts an embodiment of one of the bit line driver circuits 106-1 ... 106-M of FIG. 1. As shown in FIG. 4, a bit line driver circuit 406 includes a PMOS transistor 420 and an NMOS transistor 422 that is connected in parallel with the PMOS transistor. The PMOS transistor is connected to the voltage supply circuit 110 (shown in FIG. 1) and a bit line. The PMOS transistor is used to pre-charge the bit line. The NMOS transistor is connected to the electrical ground, which is labeled as "gnd," and the bit line. In some embodiment, instead of the NMOS transistor, the bit line driver circuit includes other analogue or digital pull-down circuit. For example, the bit line driver circuit may include current mirrors or multiple parallel NMOS transistors of different sizes.

A conventional bit line driver circuit usually uses a single PMOS transistor to source current from a voltage supply circuit. Compared with the conventional bit line driver circuit, the bit line driver circuit 406 uses the NMOS transistor 422 or other pull-down circuit to sink the bit line current to the ground during a write operation. Because the NMOS transistor can be made considerably larger than each of the selection devices SD(1,1) ... SD(N,M), the NMOS transistor will be less prone to parametric fluctuations. In addition, the NMOS transistor enables accurate control of the bit line current. The improved current control of the bit line driver circuit makes the PCM array 102 less vulnerable to voltage changes of the voltage supply circuit 110 or changes in the word line voltages or bit line voltages. Thus, it is no longer necessary to precisely control the word line voltage and the bit line voltage during the SET action and the RESET action. As a result, the PCM architecture 100 can include only one voltage supply circuit for all of the word line driver circuits 104-1 ... 104-N and the bit line driver circuits 106-1 ... 106-M. Compared to maintaining two separate voltage supply circuits for the word line driver circuits and the bit line driver circuits, using only one voltage supply circuit can save component cost, achieve power savings and reduce circuit area. In addition, because the sizes of the selection devices are usually small, the selection devices may not be identical to each other. Because of the variations of the selection devices, the selection devices' abilities to conduct differ from device to device at low voltages. The high voltage supplied via the word line driver circuits to the selection devices essentially eliminates sensitivity to device mismatch of the small selection devices. Prior to a SET action or a RESET action, all bit line driver circuits and the common source driver circuit 108 are charged towards the supplied voltage of the voltage supply circuit and the intrinsic "parasitic" capacitance of the PCM array acts like a decoupling capacitor. Because the intrinsic capacitance of the PCM array can act like a decoupling capacitor, the voltage supply circuit only need a small charge pump. In addition, the charge pump current is smoothed and can be dimensioned for the average load, which gives a considerable area and stability advantage.

Turning back to FIG. 1, the common source driver circuit 108 of the PCM architecture 100 is connected to the voltage supply circuit 110, the electrical ground and source terminals, which are labeled as "S," of the access transistors SD(1,1) ... SD(N,M) in the PCM array 102 via the PCM elements E(1,1) ... E(N,M). A conventional common source driver circuit is only connected to the ground and is not connected to a voltage supply circuit. Compared to the conventional common source driver circuit, the common source driver circuit 108 is connected to both the ground and the voltage supply circuit. Because the common source driver circuit is connected to both the ground and the voltage supply circuit, different voltage levels, such as ground and high voltage, can be applied to the common source during different operations of the PCM array. For example, during the read operation and the standby operation, the common source can be connected to the ground while during the set operation and the reset operation, the common source can be connected to high voltage. Each of the PCM elements is connected to the source terminal of the access transistor of the corresponding one of the PCM cells C(1,1) ... C(N,M) and a common source line, which is connected to the common source driver circuit. In the embodiment depicted in FIG. 1, each of the PCM elements E(1,1) ... E(3,3) is connected to the source terminal of the access transistor of the corresponding one of the PCM cell C(1,1) ... C(3,3) and the common source driver circuit via the common source line.

FIG. 5 depicts an embodiment of the common source driver circuit 108 of FIG. 1. As shown in FIG. 5, a common source driver circuit 508 includes a PMOS transistor 520 and an NMOS transistor 522 that is connected in parallel with the PMOS transistor. The PMOS transistor is connected to the voltage supply circuit 110 (shown in FIG. 1) and the common source line. The NMOS transistor is connected to the ground and the common source line. During a write action, the common source driver circuit is connected to the voltage supply circuit via the PMOS transistor. During a read action, the common source driver circuit is connected to the ground via the NMOS transistor. The common source driver circuit can serve the entire PCM array 102 or a PCM array segment that spans through all of the PCM rows in the PCM array. Because the common source driver circuit can be used for the entire PCM array or a PCM array segment, the circuit sizes of the PMOS and NMOS transistors can be made large to limit the series resistance with almost no area implication.

Turning back to FIG. 1, the voltage supply circuit 110 of the PCM architecture 100 is connected to the word line driver circuits 104-1 . . . 104-N, the bit line driver circuits 106-1 . . . 106-M and the common source driver circuit 108. In an embodiment, the voltage supply circuit is the only voltage supply source for the word line driver circuits and the bit line driver circuits. The voltage supply circuit may be the only voltage supply source in the PCM architecture. In an embodiment, the voltage supply circuit includes a charge pump (not shown) to boost the supply voltage. With a charge pump, the voltage supply circuit can provide a relatively large current, for example, around 0.5 milliamp (mA), at a relatively high voltage, for example, 2-2.5 Volts (V), which is well above the typical supply voltage for a CMOS memory, which is around 1V, to change data in the PCM architecture.

FIG. 6 shows a pulse sequence diagram for a RESET action of the PCM architecture 100 of FIG. 1. FIG. 7 shows a pulse sequence diagram for a SET action of the PCM architecture of FIG. 1. However, the RESET/SET actions of the PCM architecture are not limited to the RESET action shown in FIG. 6 and the SET action shown in FIG. 7. For example, the orders of the signals may be switched in other embodiments of the RESET/SET actions. Prior to any RESET or SET action, the capacitance of the PCM array 102 need to be pre-charged by the voltage supply circuit 110, as shown in the "pre-charge" phase of FIGS. 6 and 7. During the pre-charge phase, the common source driver circuit 108 and the bit lines 1-M are charged by the voltage supply circuit to a level that is higher the threshold voltage "$V_{TH}$" of the PCM cells $C(1,1)$ . . . $C(N,M)$. As shown in FIGS. 6 and 7, during the pre-charge phase, the voltage of a selected bit line, which is labeled as "BL_sel," voltages of unselected bit lines, which are labeled as "BL_unsel," and the voltage of the common source driver circuit, which is labeled as "CSRC," are charged from zero to "$V_{reset}$." The charging in the pre-charge phase can be from zero to $V_{reset}$ or from any other voltage to $V_{reset}$, depending from the previous action which was done on the PCM architecture. However, during the pre-charge phase, the voltage of the selected word line, which is labeled as "WL_sel," and the voltages of unselected word lines, which are labeled as "WL_unsel," are unchanged and kept at zero. In the pre-charge phase, spurious programming is prevented because the word lines are still at 0 V and the bit line voltage is equal to the voltage of the common source driver. The length of the pre-charge phase depends on the capacitance of the PCM array and the output current of the voltage supply circuit. As shown in FIGS. 6 and 7, the pre-charge phase of the RESET action may be identical with the pre-charge phase of the SET action. However, in other embodiment, the pre-charge phase of the RESET action may be differentiated with the pre-charge phase of the SET action to reduce power consumption or high voltage constraints. For both the RESET action and the SET action, the PCM array is in the "armed" state after the pre-charge phase, as shown in FIGS. 6 and 7. In the armed state phase, the RESET action or the SET action can start at any moment.

For the RESET action, starting from the armed state, the selected word line is connected to the output of the voltage supply circuit 110 and the voltage of the selected word line WL_sel is charged to $V_{reset}$. However, there is still no current flowing through any of the PCM cells $C(1,1)$ . . . $C(N,M)$, because the bit line voltage is equal to the common source driver voltage for all of the PCM cells. Then, in the subsequent "RESET pulse" phase, the selected bit line is pulled down to zero volt by the corresponding one of the bit line driver circuits 106-1 . . . 106-M (the voltage of a selected bit line BL_sel is pulled to zero) and current develops in the selected PCM cell. However, no current is induced in any other PCM cell because either the bit line voltage is equal to the common source driver voltage for PCM cells in the same row of the selected PCM cell, or word line voltage is zero for PCM cells in the same column of the selected PCM cell, or a combination of both for other PCM cells in the PCM array 102. As a consequence, only the selected PCM cell will be heated up to its melting point. Alternatively, the RESET action can be started in the opposite order, i.e., by first pulling the selected bit line to zero and then connecting the selected word line to the voltage supply circuit. In addition, other signal sequences can be used to reach the same target. In an embodiment, the RESET current can also be stopped by eliminating the current via a bit line driver circuit. During the RESET pulse phase, the voltage applied to the selected word line drops slightly, by an amount that depends on the RESET current, pulse length, voltage supply output current and capacitance of PCM array. At the end of the RESET pulse phase, the cell current is shut down as quickly as possible by shutting off the selection device abruptly via the word line, to force a "quench" and prevent unwanted re-crystallization of the material of the selected PCM cell. After switching off the word line, the PCM array may enter a "recovery" phase. In the recovery phase, the bit line can be pre-charged again and the voltage supply circuit can recover from the voltage dip which occurred during the RESET action. Thus, the PCM array enters the armed state again and the next write action can take place. Alternatively, the write sequence can be closed by discharging all PCM cells in the PCM array.

For the SET action, starting from the armed state, a sequence similar to the RESET action follows. However, in the subsequent "SET pulse" phase, as the selected bit line is pulled down, the maximum current sunk by the corresponding one of the bit line driver circuits 106-1 . . . 106-M is limited to a level that is below the maximum cell current in the RESET action. Specifically, the voltage across the selected one of the PCM cells $C(1,1)$ . . . $C(N,M)$ decreases without any significant current flowing in the selected PCM cell until the voltage reaches the threshold voltage "$V_{TH}$" of the PCM cells, at which moment current starts to flow in the selected PCM cell in the SET pulse phase. When current starts to flow in the selected PCM cell, the corresponding bit line driver circuit increases voltage at the selected bit line and the current in the selected PCM cell is immediately limited, which prevents the selected PCM cell from melting and causing unwanted RESET. To increase the robustness of the SET action, the SET current is switched off gradually via the increase of the voltage of the bit line driver circuit. In an embodiment, the current drawn by a bit line driver circuit does not change with the bit line voltage. To create a fixed current that is output voltage independent, a cascaded current mirror or other structure may be used. After the SET pulse phase, the PCM array 102 can be "recovered" to the armed state or be discharged.

Although FIGS. 6 and 7 show the RESET action and the SET action for one of the PCM cells $C(1,1)$ . . . $C(N,M)$ of the PCM architecture 100, in other embodiment, multiple PCM cells can be written simultaneously. For example, the RESET action and the SET action can be performed on the PCM cells on the same word line and different bit lines. In addition, the pulse lengths and rising/falling edges of the RESET action and the SET action can be selected for specific applications.

In the RESET action, the required voltage/current at the selected one of the bit line driver circuit 106-1 . . . 106-M, the word line driver circuits 104-1 . . . 104-N and/or the common source driver circuit 108 may be drawn directly from the voltage supply 100 of the PCM architecture 100. In this case, the voltage supply circuit 110 does not need to include a charge pump for boosting the supply voltage. Drawing the required voltage/current directly from the voltage supply of the PCM architecture can save power and reduce the disturbance in the PCM array 102. In the SET action, once the threshold voltage $V_{TH}$ of PCM cells has been surpassed and the cell starts to draw current, the charge pump output voltage can be lowered. In an embodiment, the energy stored in the ripple rejection capacitor, which is the parasitic capacitance of the PCM array 102, can be used to surpass the threshold voltage $V_{TH}$ of PCM cells. After the energy stored in the ripple rejection capacitor surpasses the threshold voltage $V_{TH}$ of PCM cells C(1,1) . . . C(N,M), the bit line voltage can be clamped directly to the voltage supply during the rest of the SET pulse, which reduces both the requirements on the charge pump capacity and the power consumption of the charge pump. Alternatively, the required voltage/current at the selected one of the bit line driver circuit, the word line driver circuits and/or the common source driver circuit may be drawn from the voltage supply of the PCM architecture via switches (not shown) that can be used to optimize the voltages in the drive circuits and provide completely independent voltage control over the driver circuits.

The values stored in PCM cells C(1,1) . . . C(N,M) can be readout in read actions. In an exemplary read action, the common source driver circuit 108 or 508 is grounded, for example, via the NMOS transistor 522 to the ground, and an appropriate read bias is applied via the bit line and word line. As long as the word line voltage is large enough to open the selection devices SD(1,1) . . . SD(N,M), the read current is not reduced significantly.

Figure 8:
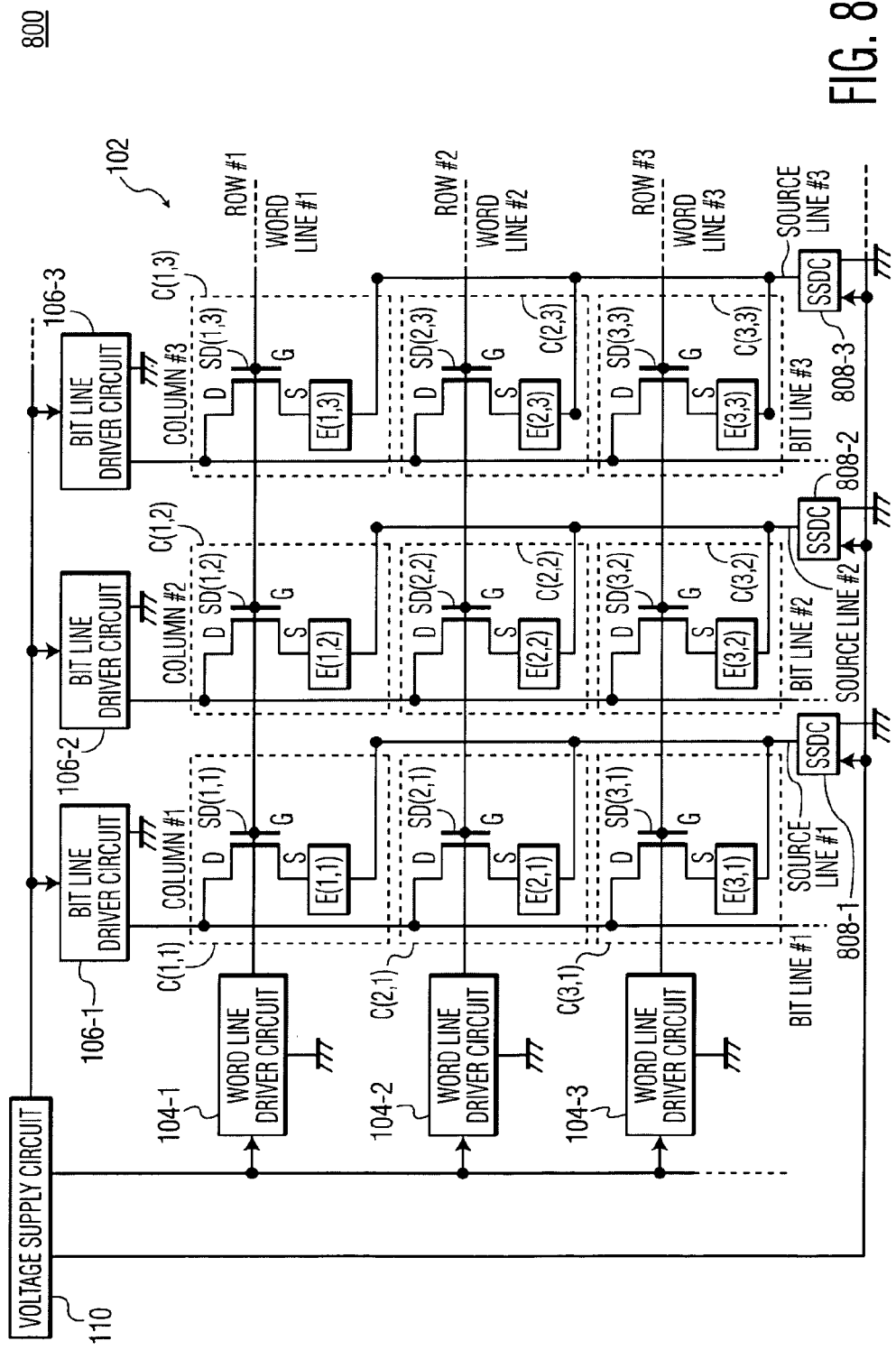
FIG. 8 is a schematic block diagram of a PCM architecture in accordance with another embodiment of the invention.

Instead of applying biases to the entire PCM array 102, the PCM cells C(1,1) . . . C(N,M) in the PCM array can be segmented and the biases can be applied to different segments of the PCM array. In an embodiment, the PCM cells in the PCM array can be segmented by bit lines into columns. For example, the PCM architecture can include a source driver circuit for each bit line or each column, which can reduce disturbance to the PCM array's ripple rejection capacitor or be used to tune the PCM array's ripple rejection capacitor. FIG. 8 is a schematic block diagram of a PCM architecture 800 in accordance with another embodiment of the invention. The PCM architecture 800 is similar to the PCM architecture 100 depicted in FIG. 1. One difference between the PCM architecture 800 and the PCM architecture 100 is that the PCM architecture 800 includes multiple segmented source driver circuits (SSDCs) 808-1 . . . 808-M, one for each bit line/each common source line.

Figure 9:
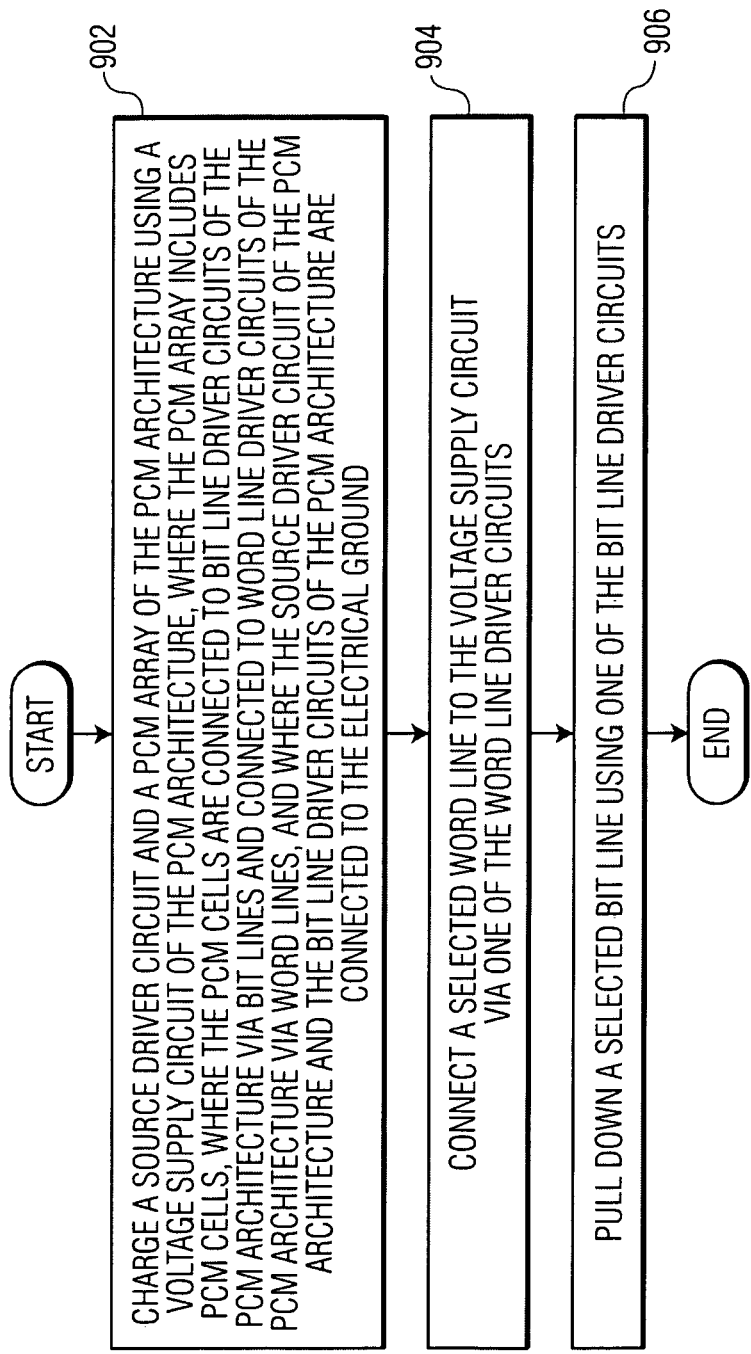
FIG. 9 is a process flow diagram of a method for writing into a PCM architecture in accordance with an embodiment of the invention.

FIG. 9 is a process flow diagram of a method for writing into a PCM architecture in accordance with an embodiment of the invention. The PCM architecture may be similar to or same as the PCM architecture 100 depicted in FIG. 1 or the PCM architecture 800 depicted in FIG. 8. The write operation shown in FIG. 9 may be the RESET action shown in FIG. 6 or the SET action shown in FIG. 7. At block 902, a source driver circuit and a PCM array of the PCM architecture is charged using a voltage supply circuit of the PCM architecture, where the PCM array includes PCM cells, where the PCM cells are connected to bit line driver circuits of the PCM architecture via bit lines and connected to word line driver circuits of the PCM architecture via word lines, and where the source driver circuit of the PCM architecture and the bit line driver circuits of the PCM architecture are connected to the electrical ground. At block 904, a selected word line is connected to the voltage supply circuit via one of the word line driver circuits. At block 906, a selected bit line is pulled down using one of the bit line driver circuits.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more feature.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A phase change memory (PCM) architecture, the PCM architecture comprising:
   a PCM array, wherein the PCM array comprises a plurality of rows of PCM cells, wherein each of the rows of PCM cells comprises a plurality of PCM cells, and wherein each PCM cell comprises:
   a PCM element configured to store a value; and
   a selection device connected to the PCM element and used to select the PCM element;
   a plurality of word line driver circuits connected to the rows of PCM cells, wherein each of the word line driver circuits is used to access one of the rows of PCM cells;
   a plurality of bit line driver circuits connected to the rows of PCM cells and an electrical ground, wherein each of the bit line driver circuits is used to access a PCM cell in each of the rows of PCM cells;
   a source driver circuit connected to source terminals of at least some of the selection devices in the PCM array and the electrical ground; and
   a voltage supply circuit configured to provide a positive voltage to the word line driver circuits, the bit line driver circuits and the source driver circuit, wherein during a program operation, a selected bit line driver circuit and a selected source driver circuit precharge a selected bit line and a selected source line to the positive voltage, followed by a set operation and a reset operation, wherein during the set operation and the reset operation, the selected source driver circuit applies the positive voltage to the selected source line, and the bit line driver circuit pulls down the selected bit line.

2. The PCM architecture of claim 1, wherein the voltage supply circuit is the only voltage supply source for the word line driver circuits and the bit line driver circuits.

3. The PCM architecture of claim 1, wherein each of the bit line driver circuits is connected to a PCM cell in each of the rows of PCM cells through a bit line, and wherein each of the bit line driver circuits comprises:

a p-channel metal oxide semiconductor (PMOS) transistor connected to the voltage supply circuit and a corresponding bit line; and an n-channel metal oxide semiconductor (NMOS) transistor connected to the electrical ground and the corresponding bit line.

4. The PCM architecture of claim 3, wherein the selection device of each PCM cell is implemented as a metal oxide semiconductor (MOS) transistor, and wherein each of the bit line driver circuits is connected to a drain terminal of the MOS transistor of a PCM cell in each of the rows of PCM cells through a bit line.

5. The PCM architecture of claim 1, wherein the selection device of each PCM cell is implemented as a metal oxide semiconductor (MOS) transistor, wherein the PCM element of each PCM cell is connected to a source terminal of the MOS transistor of the PCM cell and a common source line, and wherein the source driver circuit comprises:

a p-channel metal oxide semiconductor (PMOS) transistor connected to the voltage supply circuit and the common source line; and an n-channel metal oxide semiconductor (NMOS) transistor connected to the ground and the common source line.

6. The PCM architecture of claim 1, wherein the selection device of each PCM cell is implemented as a metal oxide semiconductor (MOS) transistor, wherein the PCM architecture comprises a plurality of source driver circuits, and wherein each of the source driver circuits is connected to source terminals of the MOS transistors at a bit line and the electrical ground.

7. The PCM architecture of claim 1, wherein the selection device of each PCM cell is implemented as a metal oxide semiconductor (MOS) transistor, wherein each of the word line driver circuits is connected to the electrical ground and gate terminals of the MOS transistors in one of the rows of PCM cells through a word line.

8. The PCM architecture of claim 2, wherein the PCM architecture is insensitive to device mismatch of the selection devices and wherein each PCM element is configured to switch between a high resistance state and a low resistance state.

9. The PCM architecture of claim 1, wherein the selection device of each PCM cell in the PCM array is implemented as a metal oxide semiconductor (MOS) transistor.

10. The PCM architecture of claim 1, wherein the parasitic capacitance of the PCM array is a ripple rejection capacitor and wherein at least one of the word line driver circuits is an inverter circuit.

11. A phase change memory (PCM) architecture, the PCM architecture comprising:

a PCM array, wherein the PCM array comprises a plurality of rows of PCM cells, wherein each of the rows of PCM cells comprises a plurality of PCM cells, and wherein each PCM cell comprises:

a PCM element configured to store a value; and a selection device connected to the PCM element and used to select the PCM element;

a plurality of word line driver circuits connected to the rows of PCM cells, wherein each of the word line driver circuits is used to access one of the rows of PCM cells;

a plurality of bit line driver circuits connected to the rows of PCM cells and an electrical ground, wherein each of the bit line driver circuits is connected to a PCM cell in each of the rows of PCM cells through a bit line, and wherein each of the bit line driver circuits comprises:

a p-channel metal oxide semiconductor (PMOS) transistor connected to a voltage supply circuit and a corresponding bit line; and an n-channel metal oxide semiconductor (NMOS) transistor connected to the electrical ground and the corresponding bit line;

a source driver circuit connected to source terminals of at least some of the selection devices in the PCM array and the electrical ground; and the voltage supply circuit configured to provide a positive voltage to the word line driver circuits, the bit line driver circuits and the source driver circuit, wherein the voltage supply circuit is the only voltage supply source for the word line driver circuits and the bit line driver circuits, and wherein during a program operation, a selected bit line driver circuit and a selected source driver circuit precharge a selected bit line and a selected source line to the positive voltage, followed by a set operation and a reset operation, wherein during the set operation and the reset operation, the selected source driver circuit applies the positive voltage to the selected source line, and the bit line driver circuit pulls down the selected bit line.

12. The PCM architecture of claim 11, wherein the selection device of each PCM cell is implemented as a metal oxide semiconductor (MOS) transistor, wherein the PCM element of each PCM cell is connected to a source terminal of the MOS transistor of the PCM cell and a common source line, and wherein the source driver circuit comprises:

a PMOS transistor connected to the voltage supply circuit and the common source line; and an NMOS transistor connected to the ground and the common source line.

13. The PCM architecture of claim 12, wherein each of the bit line driver circuits is connected to a drain terminal of the MOS transistor of a PCM cell in each of the rows of PCM cells through a bit line.

14. The PCM architecture of claim 11, wherein the selection device of each PCM cell is implemented as a metal oxide semiconductor (MOS) transistor, wherein the PCM architecture comprises a plurality of source driver circuits, and wherein each of the source driver circuits is connected to source terminals of the MOS transistors at a bit line and the electrical ground.

15. The PCM architecture of claim 11, wherein the selection device of each PCM cell is implemented as a metal oxide semiconductor (MOS) transistor, wherein each of the word line driver circuits is connected to the electrical ground and gate terminals of the MOS transistors in one of the rows of PCM cells through a word line.

16. The PCM architecture of claim 11, wherein each PCM element is configured to switch between a high resistance state and a low resistance state.

17. The PCM architecture of claim 11, wherein the selection device of each PCM cell in the PCM array is implemented as a metal oxide semiconductor (MOS) transistor.

18. The PCM architecture of claim 11, wherein at least one of the word line driver circuits is an inverter circuit.

19. A method for writing into a phase change memory (PCM) architecture, the method comprising:

charging a source driver circuit and a PCM array of the PCM architecture using a voltage supply circuit of the PCM architecture, wherein the PCM array comprises a plurality of PCM cells, wherein the PCM cells are connected to bit line driver circuits of the PCM architecture via bit lines and connected to word line driver circuits of the PCM architecture via word lines, and wherein the source driver circuit of the PCM architecture and the bit line driver circuits of the PCM architecture are connected to an electrical ground;

applying a positive voltage to a selected word line by the voltage supply circuit via one of the word line driver circuits; and wherein the method further includes:

during a program operation, precharging a selected bit line and a selected source line to the positive voltage using a selected bit line driver circuit and a selected source driver circuit, followed by a set operation and a reset operation, during the set operation and the reset operation, applying the positive voltage to the selected source line using the selected source driver circuit, and pulling down the selected bit line using the selected bit line driver circuit.

20. The method of claim 19, wherein currents in the PCM cells are referenced to the ground and wherein pulling down the selected bit line using one of the bit line driver circuits comprises pulling down only the selected bit line using only one of the bit line driver circuits.

\* \* \* \* \*